United States Patent
Cercelaru

(10) Patent No.: US 8,965,316 B2
(45) Date of Patent: Feb. 24, 2015

(54) FINE GAIN TUNING

(75) Inventor: Sever Cercelaru, Cannes la Bocca (FR)

(73) Assignee: Cambridge Silicon Radio Limited (GB)

( * ) Notice: Subject to any disclaimer, the term of this patent is extended or adjusted under 35 U.S.C. 154(b) by 164 days.

(21) Appl. No.: 13/387,893

(22) PCT Filed: Jul. 16, 2010

(86) PCT No.: PCT/EP2010/060360
§ 371 (c)(1),
(2), (4) Date: Feb. 23, 2012

(87) PCT Pub. No.: WO2011/012474
PCT Pub. Date: Feb. 3, 2011

(65) Prior Publication Data
US 2012/0142294 A1 Jun. 7, 2012

(30) Foreign Application Priority Data

Jul. 31, 2009 (GB) .................................. 0913446.1

(51) Int. Cl.
*H04B 1/06* (2006.01)
*H04B 7/00* (2006.01)
*H04B 1/16* (2006.01)
*H03J 3/06* (2006.01)

(52) U.S. Cl.
CPC ........................................ *H03J 3/06* (2013.01)
USPC .................. 455/232.1; 455/192.3; 455/200.1; 455/249.1

(58) Field of Classification Search
USPC ...................... 455/182.3, 184.1, 192.3, 195.1, 455/197.2–197.3, 200.1, 232.1, 455/234.1–234.2, 240.1; 330/278
See application file for complete search history.

(56) References Cited

U.S. PATENT DOCUMENTS

| 5,212,484 | A | * | 5/1993 | Hillis ............................. 341/154 |
| 6,611,611 | B2 | * | 8/2003 | Oka et al. ...................... 382/110 |
| 6,720,866 | B1 | * | 4/2004 | Sorrells et al. ............... 340/10.4 |
| 7,245,890 | B2 | * | 7/2007 | Kumagawa et al. .......... 455/130 |
| 7,330,708 | B2 | * | 2/2008 | Umewaka et al. ......... 455/193.1 |

(Continued)

FOREIGN PATENT DOCUMENTS

| GB | 359660 | 10/1931 | |
| GB | 1216308 | 12/1970 | ................ H03J 3/16 |
| WO | WO 2007/056730 A2 | 5/2007 | ............. H03K 17/16 |

OTHER PUBLICATIONS

"International Search Report", mailed Nov. 5, 2010, PCT Application No. PCT/EP2010/060360.

(Continued)

*Primary Examiner* — Simon Nguyen
(74) *Attorney, Agent, or Firm* — Dergosits & Noah LLP

(57) ABSTRACT

A circuit tuneable between first and second frequencies comprising gain control circuitry operable to control the gain of the circuit between the first and second frequencies, the gain control circuitry comprising a resistor network having: at least two resistor lines arranged in parallel, each resistor line comprising one or more resistors; and for each resistor line, a switch operable to select or deselect the corresponding resistor line; the resistor lines and switches being arranged such that the net resistance of the resistor network is the parallel sum of each of the selected resistor lines; and logic circuitry configured to control said switches so as to minimize the variation in gain of the circuit between the first and second frequencies.

30 Claims, 3 Drawing Sheets

(56) References Cited

U.S. PATENT DOCUMENTS

| | | | |
|---|---|---|---|
| 7,626,467 B1* | 12/2009 | Butenhoff et al. | 331/74 |
| 7,840,200 B2* | 11/2010 | Kang et al. | 455/188.1 |
| 7,902,924 B2* | 3/2011 | Cao | 330/304 |
| 2004/0116091 A1* | 6/2004 | McGinn | 455/193.1 |
| 2004/0185813 A1* | 9/2004 | Nagahama et al. | 455/139 |
| 2005/0261797 A1* | 11/2005 | Cyr et al. | 700/121 |
| 2006/0154636 A1* | 7/2006 | Shah et al. | 455/290 |
| 2007/0008046 A1 | 1/2007 | Godambe | 331/135 |
| 2007/0052865 A1 | 3/2007 | Suzuki et al. | 348/731 |
| 2008/0003970 A1 | 1/2008 | Cowley et al. | 455/307 |
| 2009/0009250 A1* | 1/2009 | Satoh et al. | 330/277 |
| 2009/0096527 A1* | 4/2009 | Ishiguro | 330/277 |
| 2009/0124227 A1* | 5/2009 | Ishiguro | 455/249.1 |
| 2009/0226188 A1* | 9/2009 | Komatsu | 398/202 |
| 2009/0251618 A1 | 10/2009 | Gao et al. | 348/731 |

OTHER PUBLICATIONS

"Intellectual Property Office Search Report", mailed Oct. 21, 2010, Application No. GB0913446.1.

* cited by examiner

FINE GAIN TUNING

CROSS REFERENCE TO RELATED APPLICATIONS

This application is a U.S. National Phase Application of International Application No. PCT/EP2010/060360, "Fine Grain Tuning" filed Jul. 16, 2010 which claims priority to Great Britain Patent Application No. GB 0913446.1, "Fine gain adjustment of tuned circuit for UWB receiver" filed Jul. 31, 2009 which are both incorporated by reference.

BACKGROUND OF THE INVENTION

This invention relates to gain tuning in radio frequency circuits. In particular, the present invention relates to improvements in gain tuning across wide frequency bands.

A radio receiver will typically be configured to receive radio frequency signals across a range of frequencies, with frequency tuning circuitry being employed to allow the radio receiver to tune into a signal at a particular frequency within the range. Generally a range of frequencies is termed a band, particularly if the frequencies of the band are used for a common purpose or type of radio signal. With conventional tuning circuits, it is difficult to achieve constant gain across a frequency band, especially when the band is wide. The gain of a conventional tuning circuit therefore varies with the frequency to which the receive circuitry is tuned.

The variation in gain of a tuning circuit has a negative effect on the performance of a radio receiver because the following amplification and signal processing stages must be configured to take the gain variation into account (e.g. to avoid clipping of the signal). This leads to decreased receiver efficiency and poor performance in some regions of the frequency band.

Previously, the problem of gain "ripples" in the tuning circuits of radio receivers has been approached through the use of additional active circuitry (that consumes additional power), which can improve the gain flatness of a tuning circuit but which introduces other problems. Furthermore, the prior art methods for dealing with gain variation do not cope well with very wide frequency bands, such as those used in ultra-wideband (UWB) communications. Conventional UWB radio receivers and other large bandwidth amplifier therefore often employ multiple tuning circuits in order to cover each band group of the UWB spectrum. Furthermore, such receivers and amplifiers generally utilise negative feedback to cope with the large bandwidth, which lowers the gain and increases the noise in the received/amplified signal.

The variation in gain with frequency of a tuning circuit in a typical wide bandwidth receiver is shown in FIG. 1. The figure shows the gain of the tuning circuit dropping off towards the edges 11 of the frequency band of interest, $\Delta f$. As the bandwidth over which the tuning circuit operates is increased, this characteristic becomes increasingly severe. The 3 dB bandwidth of the tuning circuit is given by $f_0$ (the mean of $f_1$ and $f_2$) divided by 2Q (where Q is the equivalent quality factor of the tuning circuit). To increase the 3 dB bandwidth of the circuit, one therefore has to lower the quality factor, Q. This can help to flatten the gain variation over the frequency band but in order to maintain a given gain level, the current consumption of the tuning circuit increases (for a given gain the bias current of the tuning circuit is inversely proportional to Q).

Current bleeding has been used with some success to adjust the gain of radio tuning circuits. As shown in FIG. 2, current bleeding provides a predetermined bypass current across the tuning circuitry (shown as a simple LC circuit) which helps to flatten the gain of the tuning circuit. In FIG. 2, current source 22 provides the bleed current $I_{bleed}$ across the tuning circuit comprising inductor 21 and capacitor 23. However, current bleeding as a gain adjust technique increases the noise level of the signals passed onto subsequent stages of the radio receiver and does not easily allow fine gain adjustments. Current bleeding is only practical to implement for large gain steps (of the order of 10 dB).

Conventional gain adjustment techniques suffer from several problems and do not enable fine control of the gain of a circuit across a wide frequency band without introducing noise, additional parasitic capacitances, or affecting the input impedance of the circuit. There is therefore a need for an improved tuneable circuit that does not suffer from these problems and allows fine control of the gain across a wide frequency band.

SUMMARY OF THE INVENTION

According to a first aspect of the present invention there is provided a circuit tuneable between first and second frequencies comprising gain control circuitry operable to control the gain of the circuit between the first and second frequencies, the gain control circuitry comprising: a resistor network having: at least two resistor lines arranged in parallel, each resistor line comprising one or more resistors; and for each resistor line, a switch operable to select or deselect the corresponding resistor line; the resistor lines and switches being arranged such that the net resistance of the resistor network is the parallel sum of each of the selected resistor lines; and logic circuitry configured to control said switches so as to minimise the variation in gain of the circuit between the first and second frequencies.

Suitably the circuit includes an inductance and a capacitance arranged together so as to form a resonant circuit tuneable between the first and second frequencies. The resistor network is preferably connected across the resonant circuit.

The circuit may be a tuning circuit in the receive path of a radio receiver.

The circuit may be an amplifier circuit in the transmit path of a radio transmitter.

Preferably each switch is responsive to the digital levels of the logic circuitry. The logic circuitry may further comprise a memory operable to store a plurality of digital words, each digital word representing a state of the said switches. The logic circuitry is preferably operable to control the said switches in accordance with the stored digital words.

During operation, the logic circuitry may be configured to select a digital word in dependence on the frequency to which the circuit is tuned and to control the said switches in accordance with that digital word. During operation, the logic circuitry may be configured to select a digital word in dependence on the frequency band or sub-band to which the circuit is tuned and to control the said switches in accordance with that digital word.

The digital words may be stored during manufacture. Preferably the digital words are stored during a calibration process performed on the circuit. The digital words may be periodically updated during operation of the circuit. The digital words may be updated during operation of the circuit in response to the performance of the circuit dropping below a predetermined level. The digital words are preferably updated in accordance with a trial and error algorithm configured to optimise the gain flatness of the circuit between the first and second frequencies.

Suitably the resistor DAC has a width of at least 3 bits. Suitably the variation in gain of the circuit is less than 1 dB per bit. Preferably each switch is a MOS transistor.

Preferably the circuit is a balanced circuit and each resistor line includes at least two resistors in a balanced arrangement about the switch of that resistor line.

Preferably the resistance of each switch when closed is at least a factor of 10 lower than the total resistance of the corresponding resistor line.

The first and second frequencies may delineate the range of frequencies over which the circuit is configured to operate. The range of frequencies may be at least 500 MHz.

The circuit may be a tuning circuit for a UWB radio receiver and the range of frequencies includes an entire UWB sub-band. The range of frequencies may be at least 1500 MHz. The range of frequencies may include an entire UWB band group.

Preferably the gain flatness of the circuit is better than 4 dB between the first and second frequencies. Preferably the gain settling time of the circuit is less than 1 ns. Preferably the circuit is embodied in a single integrated circuit.

According to a second aspect of the present invention there is provided a radio receiver comprising a circuit as described herein, the circuit being a tuning circuit arranged to receive signals from an antenna of the radio receiver.

The radio receiver may be a UWB radio receiver.

DESCRIPTION OF THE DRAWINGS

The present invention will now be described by way of example with reference to the accompanying drawings, in which.

DETAILED DESCRIPTION OF THE DRAWINGS

The following description is presented to enable any person skilled in the art to make and use the invention, and is provided in the context of a particular application. Various modifications to the disclosed embodiments will be readily apparent to those skilled in the art.

The general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The present invention addresses the issue of gain flatness over wide frequency bands and provides a circuit for reducing gain ripple which does not suffer from the problems associated with prior art methods of gain adjustment. The invention is suitable for implementation in any circuit requiring analogue equalization, and in particular in the tuning circuitry of any radio receiver or transmitter, including ultra-wideband (UWB) transceivers.

Figure 3:
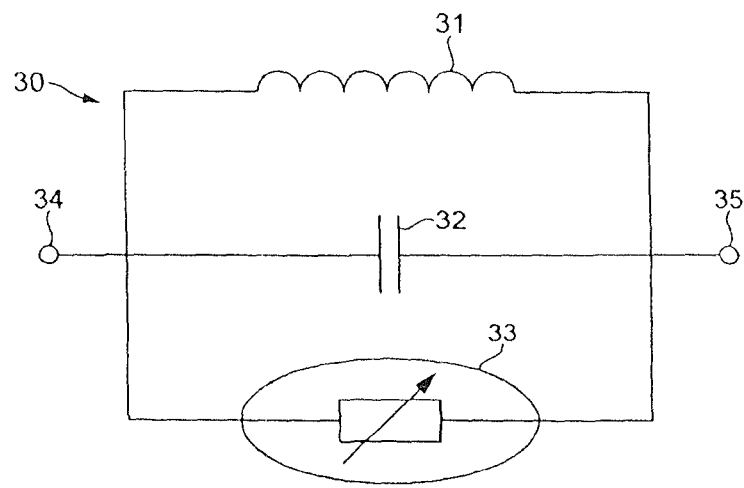
FIG. 3 is a schematic overview of a tuning circuit configured in accordance with the present invention.

A general overview of a tuning circuit (or "tank" circuit) 30 configured in accordance with the present invention is shown in FIG. 3. The tuning circuit is shown as a simple LCR circuit comprising an inductor 31, capacitor 32 and resistor network 33. The tuning circuit is typically located in the radio frequency (RF) front-end of a radio receiver but the tuning circuit can also be useful in the radio transmit path, e.g. for reducing the ripple in up-converting mixers. As is well known in the art, the inductor, capacitor, or both, are variable so as to allow the circuit to be tuned to the frequency at which a signal of interest is located. FIG. 3 shows a basic LCR tuning circuit but the present invention is in no way limited to operating only with such a tuning circuit. The present invention can be used with any kind of tuning circuit, which could have multiple switchable or variable inductances and capacitances.

Figure 4:
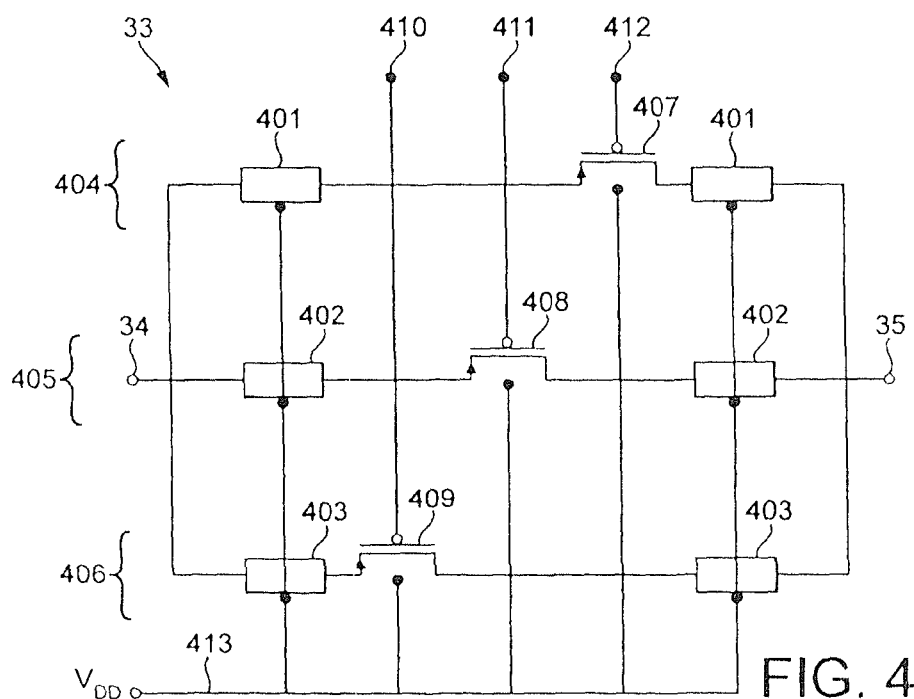
FIG. 4 is a schematic diagram of a resistor DAC configured in accordance with the present invention and suitable for use in the tuning circuit shown in FIG. 3.

Resistor network 33 forming the gain control circuitry of the present invention is shown in more detail in FIG. 4 as a fully balanced 3-bit programmable resistor DAC with binary-weighted resistor values. The DAC comprises resistors 401, 402 and 403 arranged in resistance lines 404, 405 and 406, respectively. In a fully balanced circuit resistors 401 have a first value, resistors 402 a second value, and so on. However, in a single-ended design there may be only one resistor per resistor line, or the two or more resistors in a given resistor line may have different values. Switches 407, 408 and 409 allow the individual resistor lines 404, 405 and 406 to be switched on or off so as to create different combinations of resistors in parallel. In this manner the net resistance of the DAC can be selected.

A parallel resistor DAC configured in accordance with the present invention may be used in the receive and transmit circuits of wideband radio receivers/transmitters where analogue equalisation of the receive/transmit signal is required—for example, in radio frequency tuned amplifiers and gain circuits.

It is preferred that the present invention is implemented as a balanced circuit since this does not impact the head-room available to the active circuit which uses the tuning circuit (e.g. the following amplifier). The parallel structure of the circuit (see FIG. 4) when configured in a differential arrangement, causes nodes 34 and 35 to operate at the same DC potential. The circuit will not therefore drop voltage from the limited supply voltage available.

Switches 407, 408 and 409 may be any kind of switch but are preferably metal oxide semiconductor (MOS) devices which can be sized such that their ON-resistance is around 10× lower than the resistor(s) they switch (i.e. the resistors on the same resistance line as the switch). In FIG. 4 which illustrates a positive supply referenced tank (tuning) circuit, the switches are shown as PMOS devices. If the tank reference is a negative supply, the switches would be NMOS devices, as will be apparent to a person of skill in the art.

FIG. 4 shows a preferred embodiment for an integrated circuit in which the resistors of the DAC are referenced to the appropriate supply voltage. In other words, the third terminal of each integrated resistor (the silicon substrate) is tied to the appropriate supply voltage (for the PMOS devices of FIG. 4, this is $V_{DD}$). By referencing the resistors to the appropriate supply voltage, the parasitic components of the resistors are minimised, allowing the circuit to be used up to high frequencies.

Control lines 410, 411 and 412 allow digital circuitry to set the net resistance of the DAC between points 34 and 35. The resistor lines 404, 405 and 406 may be given any appropriate resistance values. However, it is advantageous if the resistance of each line 404, 405 and 406 is different because this creates the greatest number of resistance combinations. For example, the 3-bit resistor DAC shown in FIG. 4 can be set to one of seven different resistance values (or eight if the open circuit option is included in which all of the resistor lines are switched off) if the resistors 401, 402 and 403 have different values. More generally, for an N-bit resistor DAC the circuit offers $2^N$ resistance values (including the open circuit option).

Figure 1:
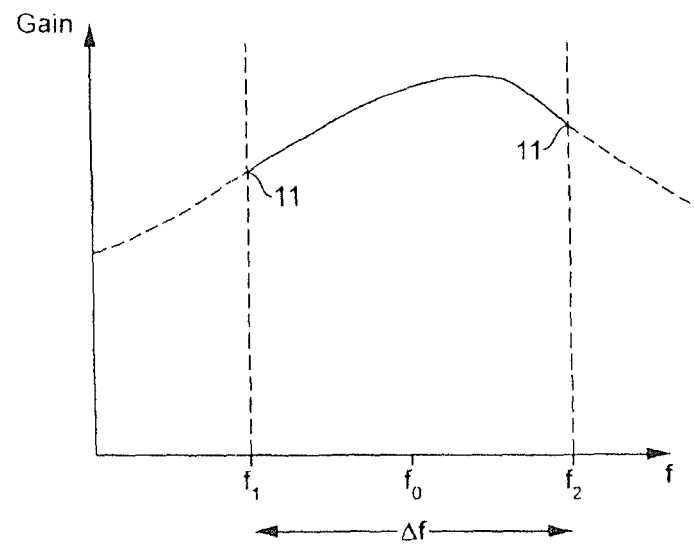
FIG. 1 is a graph illustrative of gain versus frequency for a conventional tuning circuit over a frequency band, $\Delta f$.
Figure 2:
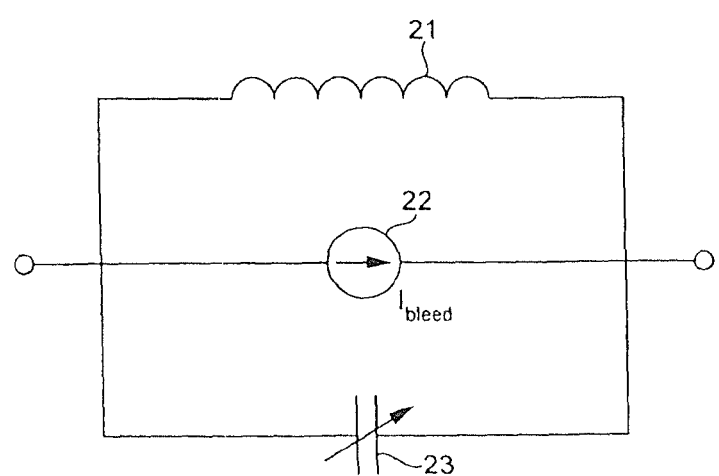
FIG. 2 is a schematic diagram of a prior art tuning circuit employing current bleeding to flatten the gain of the tuning circuit.

Resistor network 33 acts to damp oscillations in tuning circuit 30, which has the effect of lowering the gain of the tuning circuit. Equivalently, the resistor network can be said to lower the Q-factor of the tuning circuit, or "de-Q" the circuit. The lower the net resistance of the resistor network 33, the lower the Q-factor is pushed (since the resistor network is parallel to the reactive elements L and C). The gain of the tuning circuit can therefore be controlled by resistor network. Referring back to FIG. 1, in order to flatten the gain across a frequency band, the net resistance of network 33 is switched between a lower net resistance value where the gain of the tuning circuit is high (in the central portion of FIG. 1) and a higher net resistance value where the gain of the tuning circuit is low (e.g. at the extremities of the frequency band shown in FIG. 1). In other words, when circuit 30 is tuned to a frequency in the centre of the frequency band shown in FIG. 1, a lower resistance is selected at the resistor DAC, and when circuit 30 is tuned to a frequency towards the extremities of the frequency band shown in FIG. 1, a higher resistance is selected at the resistor DAC. At intermediate frequencies an intermediate resistance is selected at the resistor DAC. In this manner the gain across the frequency band can be adjusted as the frequency at which the circuit operates changes so as to maintain a flat gain characteristic.

The gain of circuit 30 is controlled by control lines 410, 411 and 412 (themselves controlled by appropriate logic circuitry) which are arranged to switch on and off switches 409, 408 and 407, respectively. For example, when control line 410 is low, switch 409 is on; when control line 412 is high, switch 407 is off. The switches in FIG. 4 are PMOS, so the gate has to be low in order to turn them on; the converse is true if NMOS devices are used. It can therefore be seen that a set of digital values (low or high, 0 or 1) applied at the control lines determines the net resistance of the resistor DAC. The present invention can therefore be readily integrated into a digital circuit, with switches 407, 408 and 409 being configured so as to be responsive to the digital levels applied by the logic circuitry of the digital circuit. The logic circuitry and the resistor DAC together form a gain control circuit.

FIG. 4 has been fabricated using a 90 nm process and the following resistor values: resistors 401 at 1 kΩ, resistors 402 at 500Ω, and resistors 403 at 250Ω. For better matching, 402 can be realised as 2 instances of 401 in parallel, and 403 as 4 instances of 401 in parallel, as is well-known for resistor DACs. The switches were sized as follows: switch 407 with a width of 4 µm, switch 408 with a width of 8 µm and switch 409 with a width of 16 µm (all of the switches had a length of 0.1 µm). It is preferable for the width of the switches to increase as the corresponding resistor values decrease so as to arrange the switches to have a resistance roughly 10 times lower (in the ON state) than their corresponding resistors.

The present invention is not limited in terms of the type of resistor DAC used or the bit width of the DAC (i.e. the number of resistor lines or elements which make up the switchable resistances of the DAC). A DAC is preferably selected having a bit width which is sufficiently wide to eliminate gain ripples in the tuning circuit to the required level. For example, in order to achieve a particular level of in-band gain flatness, a tuning circuit which exhibits a greater variation in gain across a frequency band may require a DAC having a bit width which is greater than a tuning circuit which exhibits a lesser variation in gain across the frequency band. On the other hand, it is important not to have an unnecessarily wide DAC because this is expensive in terms of silicon area, overly complex and generally increases the number of parasitic components, which negatively impacts the quality factor and tuning range of the tuning circuit. Generally, the use of a resistor DAC is power efficient when compared to other gain adjustment techniques because the DAC does not actively consume power, except for the very short time periods in which switching occurs, provided that nodes 34 and 35 in FIG. 4 are the same DC potential.

It has been found that a 3-bit DAC provides sufficiently good performance that a single tuning circuit can be used in ultra-wideband (UWB) radio receivers across an entire band group. For example, the BG1 band group has a bandwidth of 1584 MHz stretching from around 3.2 GHz to around 4.8 GHz and comprises three sub-bands of 528 MHz bandwidth centred at 3432 MHz, 3960 MHz and 4488 MHz. For acceptable receiver performance the tuning circuit should exhibit an in-band gain flatness of ≤4 dB. Using a 3-bit resistor DAC in accordance with the present invention it is possible to achieve ±2 dB flatness over the entire BG1 band group, as shown in FIG. 5, which is a plot of gain versus frequency over BG1 for the tuning circuit of a UWB radio receiver.

Figure 5:
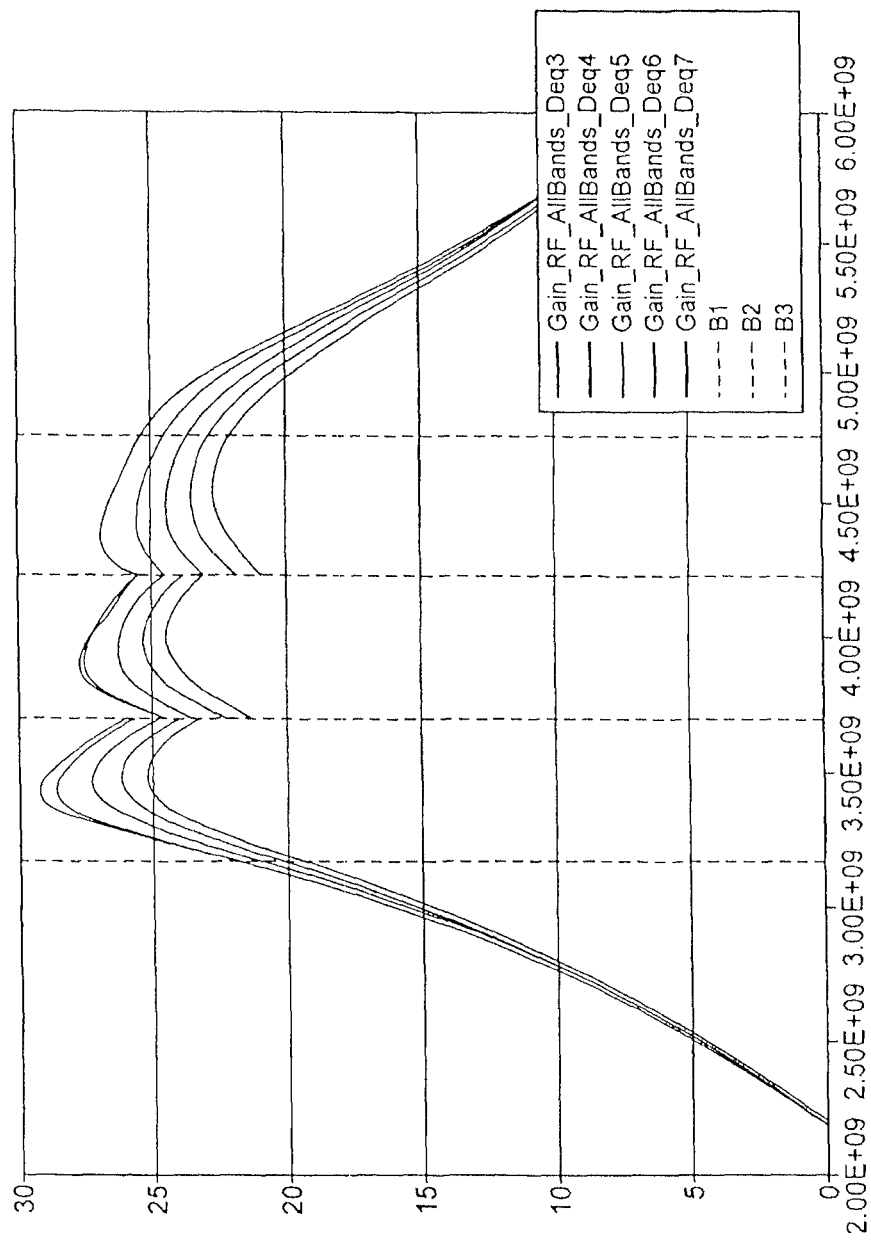
FIG. 5 is a plot of gain versus frequency for various settings of a tuning circuit that uses a resistor DAC as illustrated in FIG. 4.

The five different curves in FIG. 5 correspond to five different sets of DAC settings across the three adjacent frequency bands which make up BG1. As can be seen from the figure, the tuning circuit was configured to select a different DAC setting in each frequency band. Thus, as the UWB radio receiver hops between the different frequency bands of BG1, the resistor DAC is switched by its logic circuitry between settings so as to maintain an approximately flat gain over the band group. The lowest curve of the five is the optimum setting in this example. The selected setting of the DAC is generally different for different frequency bands. For example, in FIG. 5 the $2^{nd}$ curve from the bottom is selected for B1, the $3^{rd}$ for B2, and the $4^{th}$ for B3. The proposed resistor DAC has a fast settling time which is only limited by the turn-on time of the MOS switch and the settling of the tuning circuit. It is particularly important to have a fast settling in UWB devices, since hopping from one frequency band to another is limited to around 20 ns. This is in accordance with the UWB standard being developed by the WiMedia Alliance, which is a multi-band orthogonal frequency division multiplex (MB-OFDM) radio standard.

As described above, the net resistance of the resistor DAC is set by a digital word applied to the control lines. The digital words corresponding to the DAC settings used may be stored in a memory or register, which is preferably located at the integrated circuit (IC) embodying the gain control circuit of the present invention (this may be, for example, the communications IC handling the reception of radio frequency signals and the signal extraction and processing). It is advantageous if the DAC settings (digital words) are indexed in such a way that the logic circuitry of the gain control circuit can look up the appropriate DAC settings for the particular frequency or frequency band being used. Thus the digital words corresponding to the available DAC settings are preferably associated with a particular frequency or frequency band so that the logic circuitry applies the optimum DAC settings upon each frequency hop or shift.

In order to determine the optimum resistor DAC settings for a circuit operating in a particular frequency band, it is advantageous if the circuit is calibrated. Such calibration can be performed during manufacture or at some point before the circuit is shipped to the customer—for example, the gain of the circuit can be measured over the frequency band and the optimum settings stored in the logic circuitry. In some cases, since the gain characteristics of a resonant circuit are typically similar from one tuning circuit to another of the same design (i.e. two different samples of the same chip), the DAC settings determined for one tuning circuit could be applied to other tuning circuits manufactured according to the same production process.

Alternatively, a circuit configured in accordance with the present invention could determine the appropriate DAC settings during operation. This could be through a simple trial and error process, with different DAC settings being applied until the gain of the circuit is determined to be most flat (or the performance of the radio receiver/transmitter is determined to be at its optimum according to some other metric). This is the preferred method for determining the optimum DAC settings and is straightforward in modern System-on-Chip (SoC) devices in which the performance of the circuit may be observed during operation—for example, in a radio receiver circuit the relative gain and frequency response of the receiver can be observed using integrated detectors or ADCs. The DAC settings may be updated periodically or when the performance of the circuit drops below a predetermined level.

The present invention enables fine gain adjustments in a tuning circuit over a large frequency range—sufficient to allow a single tuning circuit to be used for an entire UWB band group (this process may be termed "analogue equalisation"). This lowers the cost of UWB radio receivers since a smaller silicon area is required. The invention allows fine gain adjustments through the use of suitably small resistors in the DAC or by using resistor lines that are close in value. The circuit shown in FIG. 4 allows the gain to be adjusted in steps of 1 dB/bit. Furthermore, the rapid switching time of a resistor DAC results in a tuning circuit having a short gain settling time—for the tuning circuit shown in FIG. 4 and whose gain characteristics are shown in FIG. 5, the gain settling time is less than 1 ns (of course, more generally this depends on the absolute frequency at which the tank circuit is tuned). This makes a circuit configured in accordance with the present invention well-suited to the short hopping interval of a USB system (typically around 20 ns).

The present invention is particularly advantageous used in tuning circuits which exhibit noticeable impedance variation with frequency. The preferred fully balanced architecture is less susceptible to the parasitic capacitances of the MOS transistors as only the small parasitic capacitances of the resistors load the tuning circuit.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A circuit tuneable between first and second resonant frequencies comprising gain control circuitry operable to control a gain of the circuit between said first and second resonant frequencies, the gain control circuitry comprising:
 a resistor network having:
  at least two resistor lines arranged in parallel, each resistor line comprising one or more resistors; and
  for each resistor line, a switch operable to select or deselect the resistor line;
  the resistor lines and switches being arranged such that a net resistance of the resistor network is a parallel sum of each of the selected resistor lines; and
 logic circuitry configured to control said switches so as to minimize a variation in gain of the circuit as the resonant frequency of the circuit changes between the first and second frequencies.

2. The circuit of claim 1, wherein the circuit includes an inductance and a capacitance arranged together so as to form a resonant circuit tuneable between the first and second frequencies.

3. The circuit of claim 1, wherein the resistor network is connected across the resonant circuit.

4. The circuit of claim 1, wherein the circuit is a tuning circuit in a receive path of a radio receiver.

5. The circuit of claim 1, wherein the circuit is an amplifier circuit in a transmit path of a radio transmitter.

6. The circuit of claim 1, wherein each switch is responsive to digital levels of the logic circuitry.

7. The circuit of claim 1, wherein the logic circuitry further comprises a memory operable to store a plurality of digital words, each digital word representing a state of the said switches.

8. The circuit of claim 7, wherein the logic circuitry is operable to control the said switches in accordance with the stored digital words.

9. The circuit of claim 8, wherein, during operation the logic circuitry is configured to select a digital work in dependence on a frequency to which the circuit is tuned and to control the said switches in accordance with that digital word.

10. The circuit of claim 8, wherein, during operation, the logic circuitry is configured to select a digital word in dependence on a frequency band or sub-band to which the circuit is tuned and to control the said switches in accordance with that digital word.

11. The circuit of claim 7, wherein the digital words are stored during manufacture.

12. The circuit of claim 7, wherein the digital words are stored during a calibration process performed on the circuit.

13. The circuit of claim 7, wherein the digital words are periodically updated during operation of the circuit.

14. The circuit of claim 13, wherein the digital words are updated in accordance with a trial and error algorithm configured to optimize a gain flatness of the circuit between the first and second frequencies.

15. The circuit of claim 7, wherein the digital words are updated during operation of the circuit in response to the performance of the circuit dropping below a predetermined level.

16. The circuit of claim 1, wherein the resistor DAC has a width of at least 3 bits.

17. The circuit of claim 1, wherein the variation in gain of the circuit is less than 1 dB per bit.

18. The circuit of claim 1, wherein each switch is a MOS transistor.

19. The circuit of claim 1, wherein the circuit is a balanced circuit and each resistor line includes at least two resistors in a balanced arrangement about the switch of that resistor line.

20. The circuit of claim 1, wherein the resistance of each switch when closed is at least a factor of 10 lower than the total resistance of the corresponding resistor line.

21. The circuit of claim 1, wherein the first and second frequencies delineate the range of frequencies over which the circuit is configured to operate.

22. The circuit of claim 21, wherein the range of frequencies is at least 500 MHz.

23. The circuit of claim 21, wherein the circuit is a tuning circuit for UWB radio receiver and the range of frequencies includes an entire UWB sub-band.

24. The circuit of claim 21, wherein the range of frequencies is at least 1500 MHz.

25. The circuit of claim 21, wherein the circuit is a turning circuit for a UWB radio receiver and the range of frequencies includes an entire UWB band group.

26. The circuit of claim 1, wherein a gain flatness of the circuit is better than 4 dB between the first and second frequencies.

27. The circuit of claim 1, wherein a gain settling time of the circuit is less than 1 ns.

28. The circuit of claim 1, wherein the circuit is embodies in a single integrated circuit.

29. A radio receiver comprising the circuit of claim 1, the circuit being a tuning circuit arranged to receive signals from an antenna of the radio receiver.

30. The radio receiver of claim 29, wherein the radio receiver is a UWB radio receiver.

\* \* \* \* \*